United States Patent
Folsom et al.

[11] Patent Number: 5,879,572
[45] Date of Patent: Mar. 9, 1999

[54] METHOD OF PROTECTING SILICON WAFERS DURING WET CHEMICAL ETCHING

[75] Inventors: Joseph Keith Folsom, Fort Wayne; Johnna Lee Haller, Noblesville; Dan Wesley Chilcott, Sharpsville, all of Ind.

[73] Assignee: Delco Electronics Corporation, Kokomo, Ind.

[21] Appl. No.: 751,350

[22] Filed: Nov. 19, 1996

[51] Int. Cl.$^6$ ................. H01L 21/3065; H01L 21/308; C23F 1/02
[52] U.S. Cl. ................. 216/49; 216/2; 216/67; 216/99; 438/710; 438/719; 438/725; 438/735; 438/745; 438/753; 438/781; 438/942; 438/970; 438/976
[58] Field of Search ................. 216/2, 49, 67, 216/99; 438/710, 719, 725, 735, 745, 753, 781, 942, 970, 976

[56] References Cited

U.S. PATENT DOCUMENTS

| | | | |
|---|---|---|---|
| 4,523,372 | 6/1985 | Balda et al. | 438/623 |
| 4,536,470 | 8/1985 | Amendola et al. | 430/314 |
| 4,911,786 | 3/1990 | Kindl et al. | 216/13 |
| 5,021,120 | 6/1991 | Buck et al. | 216/41 |
| 5,045,150 | 9/1991 | Cleeves et al. | 438/717 |
| 5,091,047 | 2/1992 | Cleeves et al. | 438/704 |
| 5,122,439 | 6/1992 | Miersch et al. | 430/311 |
| 5,559,056 | 9/1996 | Weiler | 438/612 |
| 5,700,739 | 12/1997 | Chiang et al. | 438/655 |

*Primary Examiner*—Anthony Green
*Attorney, Agent, or Firm*—Jimmy L. Funke

[57] ABSTRACT

A process for bulk micromachining a silicon wafer to form a silicon micromachined structure. The process involves the application of a protective film on one or more surfaces of the silicon wafer to protect metallization and circuitry on the wafer during the bulk micromachining process, during which a wet chemical etchant is employed to remove bulk silicon from a surface of the silicon wafer. The protective film is divinylsiloxane bisbenzocyclobutene (BCB), which has been found to be highly resistant to a wide variety of wet chemical etchants, and retains such resistant at elevated temperatures commonly preferred for bulk silicon etching. The degree to which this material is cured prior to etching is advantageously tailored to promote its resistance to the etchant and promote its adhesion to the silicon wafer.

20 Claims, 1 Drawing Sheet

METHOD OF PROTECTING SILICON WAFERS DURING WET CHEMICAL ETCHING

FIELD OF THE INVENTION

The present invention generally relates to micromachined semiconductor devices and their processing. More particularly, this invention relates to method of protecting the post-process circuitry of such devices during wet chemical etching of their micromachined structures.

BACKGROUND OF THE INVENTION

Micromachining of silicon wafers for the fabrication of microelectronics sensors is well known in the semiconductor arts. Generally, bulk micromachining processes used in the manufacture of silicon sensors involve forming a semiconductor sensing structure in a silicon wafer by wet chemical etching the bulk silicon at a surface of the wafer. Forming a sensing structure, such as a beam or diaphragm, directly from silicon is advantageous due to the excellent mechanical properties of silicon. In addition, micromachining techniques are compatible with batch fabrication methods employed with semiconductor devices, yielding a relative low cost, reliable and accurate silicon sensor that is suitable for use in many applications. Bulk micromachined sensing structures generally exhibit superior electrical properties, in that the etching process does not induce stresses that would adversely affect the accuracy of the sensor's output.

The silicon wafer in which the sensing structure is formed must be processed to enable movement of the sensing structure to be detected, such as by piezoresistive or capacitive sensing elements. In addition, the silicon wafer often includes circuitry for conditioning the output signal of the sensing elements. The conditioning circuitry can be formed before or after the sensing structure is micromachined. However, it is generally preferable to minimize processing of the wafer after etching of the micromachined structure due to the fragility of the wafer and micromachined structure, the latter of which is often a cantilever, diaphragm or beam whose thickness is less than about ten micrometers. However, if micromachining is performed after formation of the circuitry, metallizatlon of the circuitry must be protected from the caustic wet chemical etchant, which is typically an anisotropic etchant such as potassium hydroxide (KOH) or tetramethyl ammonium hydroxide (TMAH). For this purpose, metallizations are typically shielded from the etchant by mechanical fixtures, spin-on films or deposited films. However, each has drawbacks.

Spin-on films, such as waxes, photoresists and polyimides, cannot withstand caustic, high temperature conditions for extended periods. As such, these films are inadequate for use when performing a through-wafer etch.

Mechanical fixtures are usually constructed with o-rings for sealing the surface of the wafer from the etchant. These fixtures must be individually assembled on the production floor. If a dirt particle or o-ring defect is present, the wafer is typically ruined. In addition, because the o-ring must be compressed to generate an adequate seal, mechanical fixtures tend to induce stresses in the silicon wafer, particular in view of the relatively fragile state of the wafer.

Deposited films, such as oxides and nitrides, are often used to protect metallization during etching processes. However, prior art deposited films exhibit limited step coverage, i.e., the ability to simultaneously cover two or more surface features having different elevations on the surface of the wafer. Coverage of metallization with a single layer of film is generally limited to metal layers that are inadequate for high yield wire bonding. Under such circumstances, either a single thick layer or multiple layers of deposited film must be used. However, single deposited layers are prone to the formation of pin holes, while the deposition of several layers of film is expensive and the resulting multilayer film is prone to cracking. As a result, both approaches produce films whose ability to protect an underlying metallization is seriously limited. Finally, deposited films typically have relatively high etch rates in potassium hydroxide at elevated temperatures, and therefore pose a significant limitation to operating conditions of the etchant bath.

In general, the semiconductor industry is continuously seeking improvements over the above prior art methods for protecting metallizations during wet chemical etching of bulk silicon. This need is particularly in response to the desire to promote high volume manufacturing while increasing yield, improving etching conditions, and eliminating induced stresses.

SUMMARY OF THE INVENTION

It is an object of this invention to provide a process for bulk micromachining a silicon wafer having on-chip metallization, in which a wet chemical etchant is used to form a micromachined structure.

It is another object of this invention that the process entails the use of a protective film that overlies the metallization so as to protect the metallization from the etchant.

It is yet another object of this invention that the protective film is resistant to a wide variety of wet chemical etchants and exhibits step coverage superior to prior art deposited films.

It is a further object of this invention that application and removal of the protective film are compatible with bulk micromachining processes.

In accordance with a preferred embodiment of this invention, these and other objects and advantages are accomplished as follows.

According to the present invention, there is provided a process for bulk micromachining a silicon wafer to form a silicon micromachined structure. More particularly, this process involves the application of a protective film on one or more surfaces of the silicon wafer to protect metallization and circuitry on the wafer during the bulk micromachining process, during which a wet chemical etchant is employed to remove bulk silicon from a surface of the silicon wafer. The protective film is divinylsiloxane bisbenzocyclobutene (BCB), which has been found to be surprisingly compatible with bulk silicon micromachining processes when appropriately processed. Specifically, when partially cured, this material exhibits desired adhesion characteristics, is highly resistant to a wide variety of caustic wet chemical etchants, and retains such resistant at elevated temperatures commonly preferred for bulk silicon etching. In addition, this material exhibits superior step coverage as compared to prior art deposited films.

According to this invention, a protective film formed of BCB is particularly well suited for use during the fabrication of a micromachined semiconductor sensor. A sensor of a type that can be processed in accordance with this invention is composed of a silicon sensing wafer having a micromachined sensing structure, such as a diaphragm or beam, and metallization for one or more sensing elements formed to detect movement of the sensing structure. The process of this invention generally entails treating at least one surface of the silicon wafer so as to enhance the adhesion-promoting properties of the surface, and then depositing a film of the BCB material on the treated surface so as to also cover the metallization and any additional surface features that are to be protected during micromachining of the sensing structure. Thereafter, the film is partially cured, and the silicon wafer is wet chemical etched to form the sensing structure. During etching, the film prevents etching of the metallization and wafer surface underlying the film.

Following the etching step, the film may be removed using a dry or wet chemical etching technique, such as by fluorine-oxygen plasma or a negative photoresist stripper, respectively. Alternatively, the film may remain on the surface of the silicon wafer so as to serve as a permanent dielectric layer over the metallization. If so desired, portions of this dielectric layer can be selectively removed so as to expose one or more regions of the surface.

According to preferred aspects of this invention, the treatment step for the surface of the silicon wafer entails subjecting the surface to oxygen plasma activation so as to yield a more reactive oxygenated region thereon, and/or applying an adhesion-promoting compound to the surface. Furthermore, the curing step is conducted in an oxygen-containing atmosphere. The film is sufficiently cured to promote resistance of the film to the wet chemical etchant, though not fully cured so as to achieve suitable adhesion between the film and the underlying surfaces.

According to this invention, partially-cured BCB has been unexpectedly determined to be highly resistant to a wide variety of wet chemical etchants of the type used to micromachine bulk silicon. Importantly, this material retains such resistant at elevated temperatures commonly preferred for bulk silicon etching, e.g., at least 100° C. Finally, this material exhibits superior step coverage as compared to prior art deposited films. As such, BCB as a protective film for bulk silicon micromachining overcomes the shortcomings of prior art deposited films, while also completely avoiding the stress-related disadvantages of mechanical fixtures.

Other objects and advantages of this invention will be better appreciated from the following detailed description.

BRIEF DESCRIPTION OF THE DRAWINGS

The above and other advantages of this invention will become more apparent from the following description when taken in conjunction with the accompanying drawings, in which.

DETAILED DESCRIPTION OF THE INVENTION

Figure 4:
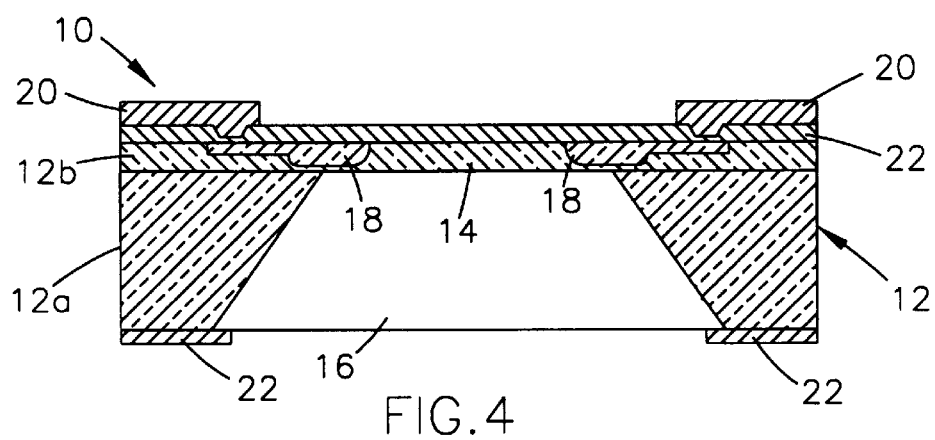

FIG. 4 illustrates a silicon micromachined pressure sensor 10 of a type that is suited for fabrication by the process of this invention. As shown, the sensor 10 includes a single-crystal silicon sensing wafer 12 in which a sensing element 14 has been bulk micromachined. Though the sensing element 14 is illustrated as a diaphragm or membrane, the element 14 could be a cantilever, beam or have significantly different geometry, and could be adapted to sense motion or acceleration instead of pressure. A cavity 16 is present beneath the sensing element 14 and at the lower surface of the wafer 12. Typically, a backplate (not shown) is bonded to the lower surface of the wafer 12 to hermetically enclose the cavity 16 for the purpose of sensing absolute pressure. Alternatively, the cavity 16 can be vented with a hole (not shown) to a known pressure to enable sensing of differential pressures. Deflection of the sensing element 14 can be sensed using any suitable technique, including piezoresistors 18 shown in FIG. 1 as doped regions of the wafer 12. Metallization 20 at the upper surface of the wafer 12 electrically connects the piezoresistors 18 to signal conditioning circuitry (not shown) present on the wafer 12 or on a second wafer (not shown).

According to this invention, the sensing element 14 is formed by bulk micromachining the wafer 12 using a caustic wet chemical etchant, such as KOH or TMAH. In order to protect the metallization 20 from such an etchant, this invention employs a specific film material that has been unexpectedly found to exhibit exceptional resistance to caustic wet chemical etchants at temperatures generally employed to attain a desirable etchant rate. The film material is divinylsiloxane bisbenzocyclobutene (BCB), which is commercially available under the name CYCLOTENE from Dow Chemical. Developed as a thin-film insulating material for multichip modules (MCMs) and integrated circuits (ICs), BCB was neither developed nor intended as an etchant-resistant film material, and such use was not known or even expected by those who developed and manufacture BCB. In addition, the process required to render BCB suitable as a protective coating for caustic wet chemical etchants was not known or expected.

Figure 1:
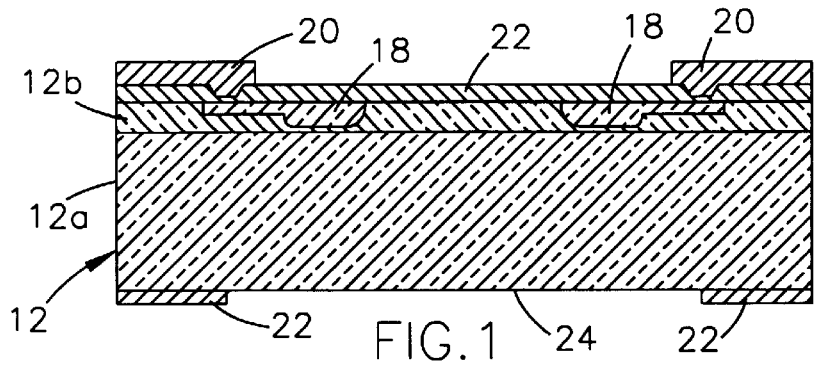
FIGS. 1 through 4 represent processing steps entailed in the micromachining of a silicon pressure sensor in accordance with this invention.

This invention generally encompasses conventional semiconductor processes to produce the structure shown in FIG. 1. As illustrated, the silicon wafer 12 is composed of a p-type base region 12a and an n-type region 12b, both of which can be formed by conventional methods. The piezoresistors 18 are shown as being formed in the n-type region 12b, and the metallizations 20 include contact portions that extend through an oxide layer 22 so as to electrically contact the piezoresistors 18. An oxide layer 22 also covers part of the lower surface of the wafer 12, leaving exposed a portion 24 of the surface through which micromachining of the wafer 12 will take place.

According to this invention, the upper surface of the wafer 12 (formed by the oxide layer 22) must be pretreated to promote adhesion of the BCB material. This can be done by treating the surface with an industry-standard adhesion promoter, such as hexamethyldisilazane (HMDS). Alternatively, the surface can be chemically altered by oxygen plasma activation so as to yield a more reactive oxygenated surface. This step can be performed with the use of a barrel plasma system or a reactive-ion etching (RIE) machine. Employing any of these treatments, the BCB material has been found to adhere well to the oxide layer 22, even after being subjected to a KOH etch at about 80° C. for a duration of five hours.

Figure 2:
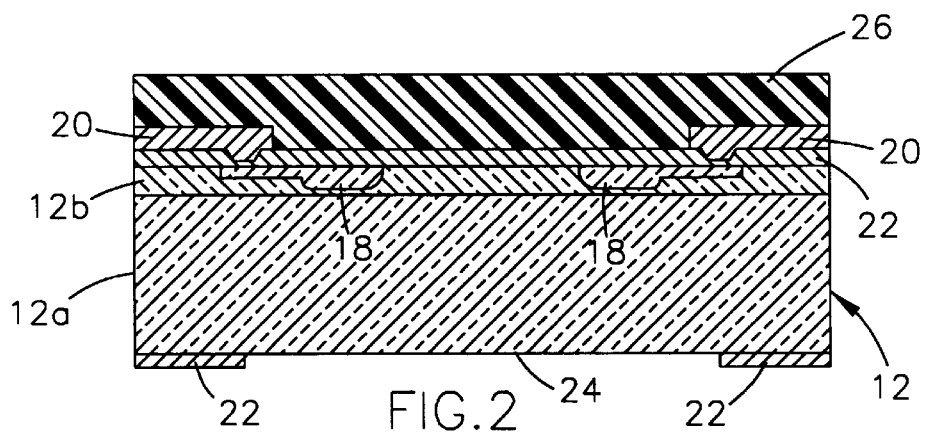

FIG. 2 illustrates the next step of this invention, in which a film 26 of the BCS material has been deposited to cover the metallizations 20 and the oxide layer 22 at the surface of the wafer 12. The film 26 is preferably applied by spin coating in a cleanroom environment to reduce particles that can become imbedded in the film 26. The film 26 is then partially cured at a temperature of about 170° C. to about 210° C. in order to obtain the properties necessary for the present application. Preferably, the curing atmosphere contains oxygen, with air being an acceptable and convenient choice. According to this invention, the ability of the film 26 to protect the underlying metallization 20 improves with the presence of oxygen in the curing atmosphere due to an oxidation reaction with BCB. Also according to the invention, the film 26 is cured to a degree sufficient to promote its resistance to caustic etchants, yet not fully cured in order for the film 26 to suitably adhere to the underlying surfaces. Importantly, each of these aspects of the invention is contrary to the established processing methods for the BCB material. Specifically, the accepted process has required that this material be fully cured in a nitrogen atmosphere to achieve desirable properties as a thin-film insulating material. That BCB would exhibit properties suitable for its use as an etch-resistant protective film if processed in accordance with this invention (i.e., only partially cured in an oxygen-containing atmosphere) was not known or even expected.

Figure 3:
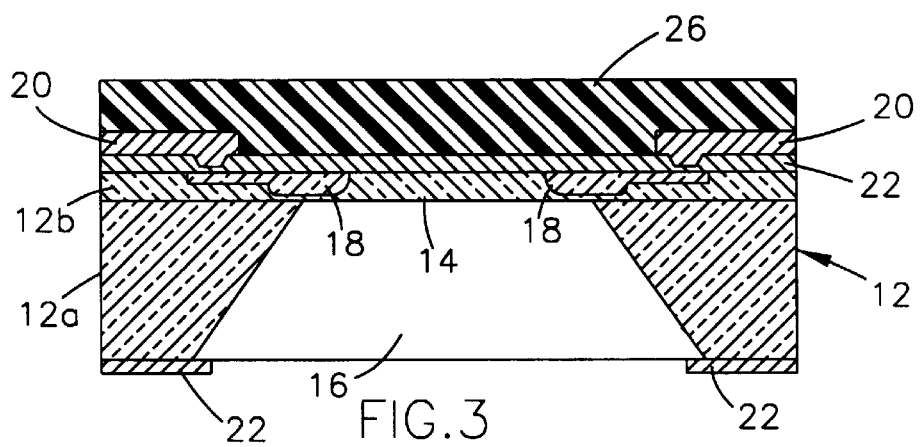

FIG. 3 illustrates the result of a caustic wet chemical etch that has been performed through the lower surface 24 of the wafer 12. The result of this etch is the sensing element 14 and cavity 16 noted previously in FIG. 4. As discussed above, suitable etchants include KOH and TMAH for this process, though it is foreseeable that other caustic wet chemical etchants could be used. As shown, suitable etchants are anisotropic and selectively etch the p-type region 12a, stopping at the n-type region 12b.

Finally, FIG. 4 shows the result of removing the film 26. According to this invention, the film 26 can be removed using a dry or wet chemistry. A suitable dry film etching process is the use of fluorine-oxygen plasma, which removes the film 26 at a rate of about one micrometer per minute, with no residuals. A suitable wet film etching process is to employ a negative photoresist stripper, followed by rinsing with a solvent. When heated to about 90° C., a known negative photoresist stripper is capable of achieving a film etch rate of about two micrometers per minute. Notably, the prior practice of fully curing the BCB material would prevent removal of the film 26 using a negative photoresist stripper.

Alternatively, the film 26 can be left on the wafer 12 to serve as a passivation layer over the metallization 20. The film 26 can also be patterned with a negative photoresist and then selectively defined with fluorine plasma or photopatterned to expose limited portions of the metallizations 20 or oxide layer 22.

A significant advantage of this invention is that the film 26 avoids the shortcomings of using mechanical fixtures, while overcoming shortcomings noted with prior art deposited films used to protect metal during etching. Specifically, the BCB film 26 is more resistant to caustic wet chemical etchants such as KOH and TMAH, even at elevated temperatures (e.g., 80° C.) used to promote the etching rate. In addition, BCB films have been successfully applied to the metallized surfaces of oxidized silicon wafers with surface structures that create steps of up to twelve micrometers. After stripping the films, there was no visible evidence of damage to the micromachined structures as a result of the film deposition and stripping processes, or as a result of stresses induced by the films.

It should be noted that, although the advantages associated with this process have been illustrated with reference to a piezoresistive pressure sensor, this invention is equally applicable to essentially any silicon material in which a structure is micromachined using a caustic wet chemical etchant. Therefore, while the invention has been described in terms of a preferred embodiment, it is apparent that other forms could be adopted by one skilled in the art. Accordingly, the scope of the invention is to be limited only by the following claims.

We claim:

1. A process for micromachining a silicon body having metallization on a surface thereof, the process comprising the steps of:

depositing a film of divinylsiloxane bisbenzocyclobutene on the surface of the silicon body and the metallization;

partially curing the film; and etching the silicon body with a caustic wet chemical etchant so as to form a micromachined structure, the film preventing etching of the metallization and the surface underlying the film.

2. A process as recited in claim 1 further comprising the step of removing the film after the etching step.

3. A process as recited in claim 2 wherein the removing step comprises dry or wet chemical etching the film after the etching step.

4. A process as recited in claim 2 wherein the removing step comprises etching by fluorine-oxygen plasma.

5. A process as recited in claim 2 wherein the removing step comprises etching with a negative photoresist stripper.

6. A process as recited in claim 1 further comprising the step of treating the surface of the silicon body prior to the depositing step so as to enhance adhesion-promoting properties of the surface.

7. A process as recited in claim 6 wherein the treating step comprises subjecting the surface to oxygen plasma activation so as to yield a more reactive oxygenated region thereon.

8. A process as recited in claim 6 wherein the treating step comprises applying an adhesion-promoting compound to the surface.

9. A process as recited in claim 1 wherein the curing step is conducted in an oxygen-containing atmosphere.

10. A process as recited in claim 1 wherein the film remains on the surface so as to serve as a dielectric layer over the metallization.

11. A process as recited in claim 10 further comprising the step of selectively removing a portion film after the etching step so as to expose a region of the surface.

12. A process as recited in claim 1 further comprising the step of forming a sensing element in the surface of the silicon body prior to the depositing step, the sensing element being in the micromachined structure after the etching step.

13. A process for micromachining a silicon body having metallization on a surface thereof, the process comprising the steps of:

treating the surface so as to enhance adhesion-promoting properties of the surface;

spin coating a film of divinylsiloxane bisbenzocyclobutene on the surface of the silicon body and the metallization;

partially curing the film in an oxygen-containing atmosphere at a temperature of about 170° C. to about 210° C.;

etching the silicon body with a caustic wet chemical etchant so as to form a micromachined structure, the film preventing etching of the metallization and the surface underlying the film; and removing the film after the etching step.

14. A process as recited in claim 13 wherein the removing step comprises etching by fluorine-oxygen plasma.

15. A process as recited in claim 13 wherein the removing step comprises etching with a negative photoresist stripper.

16. A process as recited in claim 13 wherein the treating step comprises subjecting the surface to oxygen plasma activation so as to yield a more reactive oxygenated region thereon.

17. A process as recited in claim 13 wherein the treating step comprises applying an adhesion-promoting compound to the surface.

18. A process as recited in claim 13 where the curing step is conducted in air.

19. A process as recited in claim 13 further comprising the step of forming a sensing element in the surface of the silicon body prior to the spin coating step, the sensing element being in the micromachined structure after the etching step.

20. A process for micromachining a silicon body having metallization on a surface thereof, the process comprising the steps of:

treating the surface so as to enhance adhesion-promoting properties of the surface;

spin coating a film of divinylsiloxane bisbenzocyclobutene on the surface of the silicon body and the metallization;

partially curing the film in air at a temperature of about 170° C. to about 210° C.;

etching the silicon body with a caustic wet chemical etchant so as to form a micromachined sensing structure, the film preventing etching of the metallization and the surface underlying the film; and removing the film with a negative photoresist stripper.

* * * * *